United States Patent
Wakaki et al.

(10) Patent No.: US 9,466,425 B2
(45) Date of Patent: Oct. 11, 2016

(54) GLASS CERAMIC SUBSTRATE AND METHOD FOR PRODUCING THE SAME

(71) Applicant: MURATA MANUFACTURING CO., LTD., Nagaokakyo-Shi, Kyoto-fu (JP)

(72) Inventors: Sumiyo Wakaki, Nagaokakyo (JP); Takahiro Sumi, Nagaokakyo (JP); Machiko Motoya, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 109 days.

(21) Appl. No.: 14/032,277

(22) Filed: Sep. 20, 2013

(65) Prior Publication Data

US 2014/0022699 A1    Jan. 23, 2014

Related U.S. Application Data

(63) Continuation of application No. PCT/JP2012/055373, filed on Mar. 2, 2012.

(30) Foreign Application Priority Data

Mar. 28, 2011    (JP) ................................ 2011-069411

(51) Int. Cl.
*H05K 3/24* (2006.01)
*H05K 1/09* (2006.01)
*H05K 3/40* (2006.01)
*H01G 4/10* (2006.01)
(Continued)

(52) U.S. Cl.
CPC ............ *H01G 4/105* (2013.01); *H05K 3/4007* (2013.01); *H05K 1/111* (2013.01); *H05K 3/246* (2013.01); *H05K 3/4629* (2013.01); *H05K 2201/035* (2013.01); *H05K 2203/1476* (2013.01)

(58) Field of Classification Search
CPC .......... H05K 2201/035; H05K 3/246; H05K 1/092; H05K 1/111; H05K 3/4007
See application file for complete search history.

(56) References Cited

U.S. PATENT DOCUMENTS 5,336,301 A * 8/1994 Tani et al. .................... 106/1.18
5,627,344 A * 5/1997 Tanifuji et al. ............... 174/257
(Continued)

FOREIGN PATENT DOCUMENTS

CN    1335745 A    2/2002
CN    1336790 A    2/2002
(Continued)

OTHER PUBLICATIONS

PCT/JP2012/055373 Written Opinion dated May 25, 2012.

*Primary Examiner* — Jeremy C. Norris
*Assistant Examiner* — Nathan Milakovich
(74) *Attorney, Agent, or Firm* — Arent Fox LLP

(57) ABSTRACT

A first paste film containing a metal powder and non-vitreous inorganic oxide is formed on a glass ceramic green sheet, and a second paste film containing a metal powder is formed on the first paste film to cover at least the edge portion of the first paste film. Then the glass ceramic green sheet and the first and second paste films are fired. As a result, a surface electrode is obtained, and then a plating layer is formed on the surface electrode. The second paste film contains less non-vitreous inorganic oxide than the first paste film and the abundance ratio of the non-vitreous inorganic oxide in the surface electrode is lower in a region bordering the plating layer than in a region bordering the glass ceramic layer at least in an edge portion of the surface electrode.

10 Claims, 3 Drawing Sheets

(51) Int. Cl.
*H05K 1/11* (2006.01)
*H05K 3/46* (2006.01)

(56) References Cited

U.S. PATENT DOCUMENTS

| | | | | |
|---|---|---|---|---|
| 6,355,187 | B1 * | 3/2002 | Sanada | H01B 1/16 174/117 FF |
| 7,267,713 | B2 * | 9/2007 | Adachi | C03C 8/04 106/1.14 |
| 7,423,220 | B2 * | 9/2008 | Yoneima et al. | 174/257 |
| 8,698,593 | B2 * | 4/2014 | Park et al. | 338/309 |
| 8,842,413 | B2 * | 9/2014 | Park et al. | 361/309 |
| 2001/0032737 | A1 * | 10/2001 | Taira | H01B 1/16 174/257 |
| 2002/0029838 | A1 | 3/2002 | Kawakami | |
| 2002/0034614 | A1 | 3/2002 | Kawakami et al. | |
| 2013/0020905 | A1 * | 1/2013 | Sawada et al. | 310/311 |
| 2013/0182397 | A1 * | 7/2013 | Abe | H05K 3/4629 361/748 |
| 2015/0016018 | A1 * | 1/2015 | Onishi et al. | 361/301.4 |

FOREIGN PATENT DOCUMENTS

| | | | |
|---|---|---|---|
| JP | 06232516 A * | 8/1994 | |
| JP | 2000-173346 A | 6/2000 | |
| JP | 2002-134885 A | 5/2002 | |
| JP | 2003224338 A * | 8/2003 | |
| JP | 2004-221407 A | 8/2004 | |
| JP | 2005-203631 A | 7/2005 | |
| JP | 2008112787 A * | 5/2008 | |
| JP | 2010010394 A * | 1/2010 | |
| JP | 2011077469 A * | 4/2011 | |
| JP | 2011129884 A * | 6/2011 | |

* cited by examiner

GLASS CERAMIC SUBSTRATE AND METHOD FOR PRODUCING THE SAME

CROSS REFERENCE TO RELATED APPLICATIONS

The present application is a continuation of International application No. PCT/JP2012/055373, filed Mar. 2, 2012, which claims priority to Japanese Patent Application No. 2011-069411, filed Mar. 28, 2011, the entire contents of each of which are incorporated herein by reference.

FIELD OF THE INVENTION

The present invention relates to a glass ceramic substrate and a method for producing a glass ceramic substrate and, in particular, to a glass ceramic substrate having a surface electrode and a method for producing such a glass ceramic substrate.

BACKGROUND OF THE INVENTION

An example of a known glass ceramic substrate is a laminated, multilayer ceramic substrate, which contains a stack of glass ceramic layers. A laminated glass ceramic substrate contains various wiring conductors, including those that form passive elements such as capacitors and inductors, and those used to establish connections such as electrical connections between elements.

Examples of wiring conductors placed in laminated glass ceramic substrates include internal electrodes, which are formed along the interfaces between the glass ceramic layers, and via-hole conductors, which are formed through the glass ceramic layers to provide interlayer connections.

There are also wiring conductors formed on the surface of a glass ceramic substrate, or more specifically, on the outward surface of the outermost glass ceramic layers. An example is a surface electrode. Some surface electrodes are used to couple the glass ceramic substrate to the electronic components to be placed on the surface of the substrate, and some others are used to couple the glass ceramic substrate to a motherboard. Examples of electronic components that are placed on the surface of a glass ceramic substrate include those having bumps, those to be brought into a wire-bonding process, and those having planar terminal electrodes to be soldered.

Such a surface electrode is usually formed by applying a conductive paste, which is prepared by dispersing a conductive metal powder in an organic vehicle, and then firing the applied paste. There are two ways of firing the applied conductive paste. In one, which is referred to as cofiring, the conductive paste is applied to an unfired glass ceramic layer and fired together with the glass ceramic layer. In another, the conductive paste is applied to a sintered glass ceramic layer and fired alone.

In both cases, insufficient bonding of the surface electrode to the glass ceramic layer causes the electrode to peel off. The cofiring method described above can lead to improved bonding strength because the glass component of the glass ceramic layer penetrates into the surface electrode during the firing process.

Another example of a technology that can improve the bonding strength of a surface electrode is that described in Japanese Unexamined Patent Application Publication No. 2000-173346 (Patent Document 1). Patent Document 1 discloses a conductive paste that firmly adheres to BaO—$Al_2O_3$—$SiO_2$ ceramic layers. The conductive paste described in Patent Document 1 contains a Cu powder, a ceramic powder, and an organic vehicle. Some requirements are specified for the ceramic powder. For example, (a) the ceramic powder is at least one selected from the group consisting of $Al_2O_3$, $SiO_2$, and BaO, (b) has an average particle diameter of 0.1 to 3.5 µm, and (c) constitutes 1% to 15% by volume based on the volume of the Cu powder.

According to Patent Document 1, forming a surface electrode on a ceramic layer by using this conductive paste imparts improved bonding strength to the surface electrode because during the firing process, the glass component synthesized in the ceramic layer is drawn up into the surface electrode by the action of the ceramic powder, giving the interface between the ceramic layer and the surface electrode an irregular shape, producing an anchor effect.

In general, a surface electrode formed by a printing process (e.g., screen printing) using a conductive paste tends to be thinner in the edge portion in a plan view than in the middle portion because of the effects of printing defects such as running and bleeding of the printed paste. Thus, the use of the conductive paste described in Patent Document 1 to form a surface electrode may result in reduced conductivity of the surface electrode on its surface because the glass component drawn up from the ceramic layer into the surface electrode is likely to reach the surface of the electrode and get exposed particularly in the edge portion in a plan view, the portion where the surface electrode is relatively thin.

A surface electrode obtained by firing a conductive paste is usually coated with a plating layer. For example, a surface electrode obtained by firing a conductive paste containing Cu as a conductor is coated with a plating layer such as one composed of a Ni plating film and an Au plating film formed on it. If the glass component is exposed on the surface of the surface electrode as described above, however, reduced platability of the surface electrode makes the plating layer more likely to peel off of it. In particular, reduced platability of the surface electrode in the edge portion in a plan view leads to a significantly low peeling resistance.

Patent Document 1: Japanese Unexamined Patent Application Publication No. 2000-173346

SUMMARY OF THE INVENTION

An object of the present invention is therefore to provide a glass ceramic substrate with improved peeling resistance in the interface between a surface electrode and a glass ceramic layer and between a plating layer and the surface electrode, and a method for producing such a glass ceramic substrate.

A first aspect of the invention is directed to a glass ceramic substrate having a glass ceramic layer, a surface electrode on the glass ceramic layer, and a plating layer on the surface electrode. To solve the technical problem described above, the ceramic substrate according to this aspect of the invention is configured in such a way that the abundance ratio of non-vitreous inorganic oxide in the surface electrode is lower in the region bordering the plating layer than in the region bordering the glass ceramic layer at least in the edge portion in a plan view.

A second aspect of the invention is directed to a method for producing a glass ceramic substrate having a surface electrode. To solve the technical problem described above, the method for producing a glass ceramic substrate according to this aspect of the invention includes forming a first paste film on a glass ceramic green sheet that forms an outermost layer by applying a first conductive paste containing a metal powder and non-vitreous inorganic oxide to the glass ceramic green sheet, forming a second paste film by applying a second conductive paste containing a metal powder to the first paste film to cover at least the edge portion of the first paste film in a plan view, and firing the glass ceramic green sheet and the first and second paste films. The second conductive paste contains less non-vitreous inorganic oxide than the first conductive paste.

In the method for producing a glass ceramic substrate according to this aspect of the invention, the second conductive paste may contain non-vitreous inorganic oxide as long as the non-vitreous inorganic oxide content is smaller than in the first conductive paste. Preferably, the second conductive paste contains no non-vitreous inorganic oxide.

Furthermore, experiments have indicated that it is preferred that the first conductive paste contains 7% or more by volume the non-vitreous inorganic oxide based on the total volume thereof.

It is also preferred that the second paste film covers only the edge portion of the first paste film in a plan view like a picture frame.

In these aspects of the invention, the use of $Al_2O_3$ as the non-vitreous inorganic oxide is advantageous.

These aspects of the invention achieve a situation where the abundance ratio of non-vitreous inorganic oxide in the surface electrode is lower in the region bordering the plating layer than in the region bordering the glass ceramic layer at least in the edge portion in a plan view. This reduces the amount of glass that gets exposed on the surface of the surface electrode, thereby ensuring good conductivity and, therefore, good platability, making the plating layer more firmly adhere to the surface electrode and less likely to peel off of the surface electrode.

In the method for producing a glass ceramic substrate according to the second aspect of the invention, the first conductive paste, used to form the first paste film on the glass ceramic green sheet that forms an outermost layer, contains non-vitreous inorganic oxide, and this gives the resulting glass ceramic substrate a high peeling resistance in the interface between the surface electrode and the glass ceramic layer.

This method for producing a glass ceramic substrate according to the second aspect of the invention becomes more reliable in reducing the amount of glass that gets exposed on the surface of the surface electrode when the second conductive paste contains no non-vitreous inorganic oxide.

Furthermore, the surface electrode becomes less likely to peel off of the glass ceramic layer when the first conductive paste contains 7% or more by volume the non-vitreous inorganic oxide based on the total volume thereof.

Moreover, the coplanarity of the glass ceramic substrate is improved when the second paste film covers only the edge portion of the first paste film in a plan view like a picture frame.

DETAILED DESCRIPTION OF THE PREFERRED EMBODIMENTS

Figure 1:
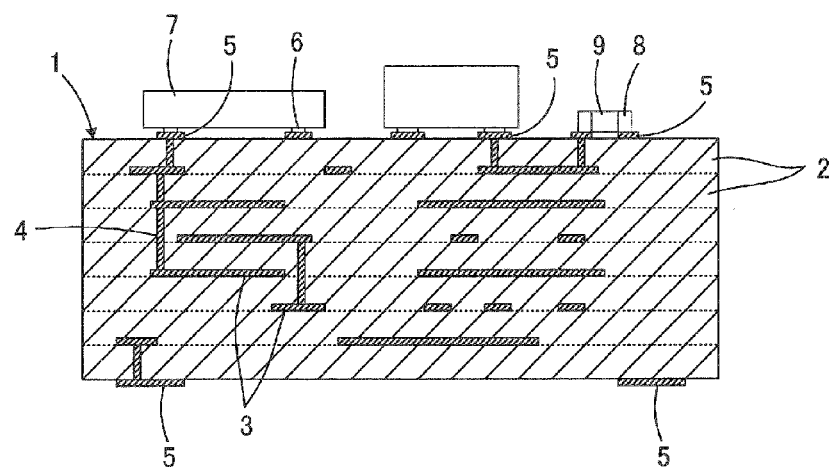
FIG. 1 is a cross-sectional diagram illustrating a glass ceramic substrate according to Embodiment 1 of the invention.

The following describes a glass ceramic substrate 1 according to Embodiment 1 of the invention with reference to FIG. 1.

The glass ceramic substrate 1 is a multilayer ceramic substrate and has a laminated structure containing a stack of several glass ceramic layers 2. The glass ceramic substrate 1 contains various wiring conductors, including those that form passive elements such as capacitors and inductors, and those used to establish connections such as electrical connections between elements. Some of the wiring conductors are placed in the glass ceramic substrate 1, and some others are on the outer surface.

Examples of the wiring conductors placed in the glass ceramic substrate 1 include internal electrodes 3, which are formed along the interfaces between the glass ceramic layers 2, and via-hole conductors 4, which are formed through the glass ceramic layers 2 to provide interlayer connections.

Surface electrodes 5 are wiring conductors formed on the surface of the glass ceramic substrate 1, or more specifically, on the outward surface of the outermost glass ceramic layers 2. Some of the surface electrodes 5 are used to couple the glass ceramic substrate 1 to the electronic components to be placed on the surface of the substrate, and some others are used to couple the glass ceramic substrate to a motherboard (not illustrated). In FIG. 1, an electronic component 7 having bumps 6 (e.g., a semiconductor device) and an electronic component 9 having planar terminal electrodes 8 (e.g., a chip capacitor) are seen. Although not illustrated, electronic components to be brought into a wide-bonding process may also be placed on the surface of a glass ceramic substrate.

Figure 2:
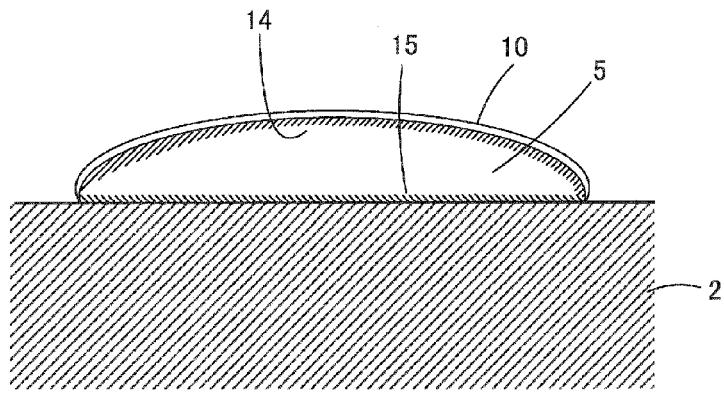
FIG. 2 is an enlarged cross-sectional view of one of the surface electrodes on the glass ceramic substrate illustrated in FIG. 1.

FIG. 2 illustrates a cross-sectional view of one of the surface electrodes 5. As illustrated in FIG. 2, each surface electrode 5 is formed on the glass ceramic layer 2, and a plating layer 10 is formed on the surface electrode 5. When the surface electrode 5 is formed by, for example, firing a conductive paste containing Cu as a conductor, the plating layer 10 is a layer such as one composed of a Ni plating film and an Au plating film formed on it.

Each surface electrode 5 is formed using a conductive paste by a process such as screen printing. Thus, each surface electrode 5 is thinner in the edge portion in a plan view than in the middle portion as can be seen from FIG. 2 because of the effects of printing defects such as running and bleeding of the printed paste. The following describes a method for producing the glass ceramic substrate 1 with reference to FIG. 3, including a method for forming the surface electrodes 5.

Several glass ceramic green sheets that form the glass ceramic layers 2 are first prepared. Then, as necessary, the internal electrodes 3 and the surface electrodes 5 and the via-hole conductors 4 are formed, by applying a conductive paste to the glass ceramic green sheets and by creating through-holes and filling them with a conductive paste, respectively.

The individual steps taken to form the surface electrodes 5 are as follows. A first conductive paste containing a metal powder and non-vitreous inorganic oxide and a second conductive paste containing a metal powder are prepared. The second conductive paste may contain non-vitreous inorganic oxide as long as the non-vitreous inorganic oxide content is smaller than in the first conductive paste; however, it is preferred that the second conductive paste contains no non-vitreous inorganic oxide. The first conductive paste preferably contains 7% or more by volume the non-vitreous inorganic oxide based on the total volume thereof. The metal powders can be Cu powders. An example of the non-vitreous inorganic oxide is $Al_2O_3$.

Figure 3:
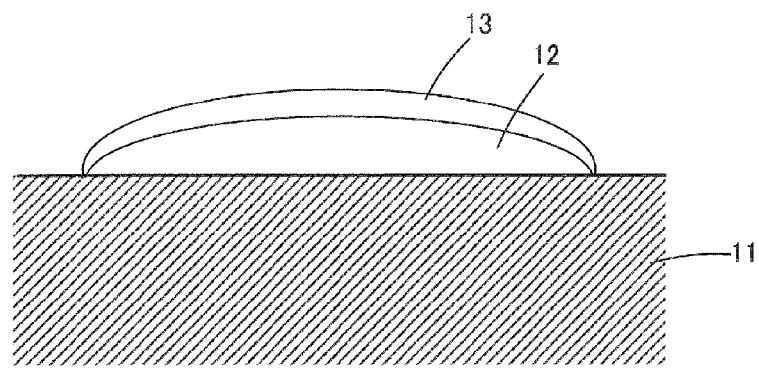
FIG. 3 is a cross-sectional diagram illustrating first and second conductive pastes applied to obtain the surface electrode illustrated in FIG. 2.

Then, as illustrated in FIG. 3, the first conductive paste is applied to each of the glass ceramic green sheets 11 that form the outermost glass ceramic layers 2 to form a first paste film 12.

Then the second conductive paste is applied to the first paste film 12 to form a second paste film 13. The second paste film 13 is preferably thinner than the first paste film 12.

This glass ceramic green sheet, which forms one of the outermost glass ceramic layers 2 and has the first and second paste films 12 and 13 on the surface thereof, is then stacked with those that form the other glass ceramic layers 2. In this way, a green sheet laminate is obtained.

Then the green sheet laminate is fired. The glass ceramic green sheet 11 and the first and second paste films 12 and 13 are therefore fired together. During this firing process, the glass component in the glass ceramic green sheet is drawn up by the non-vitreous inorganic oxide existing in the first paste film 12, as in the technology described in Patent Document 1. In the fired article, the interface between the glass ceramic layer 2 and each surface electrode 5 has an irregular shape, producing an anchor effect which makes the surface electrode 5 more firmly adhere to the glass ceramic layer 2. This positive effect on bonding strength is enhanced when the first conductive paste, which is used to form the first paste film 12, contains 7% or more by volume the non-vitreous inorganic oxide based on the total volume thereof.

The glass component drawn up in the way described above exists at least in the region formed by the first paste film 12. In particular, in the edge portion in a plan view, in which the first paste film 12 is thinner than in other portions, the glass component may reach the surface of the region formed by the first paste film 12 and get exposed. However, it is unlikely that the second paste film 13, which covers the first paste film 12, is supplied with the glass component since the second paste film 13 contains less non-vitreous inorganic oxide than the first paste film 12. The supply of the glass component is reduced in a more reliable manner when the second paste film 13 contains no non-vitreous inorganic oxide.

In this way, the surface electrode 5 is formed as illustrated in FIG. 2.

Then, as illustrated in FIG. 2, a plating layer 10 is formed on the surface electrode 5. The plating layer 10 can be formed by electrolytic or electroless plating. The plating layer 1 is composed of, for example, a Ni plating film and an Au plating film formed on it.

The glass ceramic substrate 1 is completed in this way. As illustrated in FIG. 1, the surface electrodes 5 of this glass ceramic substrate 1 facing upward in the drawing are coupled to the electronic components 7 and 9. The downward-facing surface electrodes 5 are used to couple the glass ceramic substrate 1 to a motherboard (not illustrated).

As illustrated in FIG. 2, the surface electrode 5 has an unclear boundary between the region derived from the first paste film 12 and that derived from the second paste film 13. However, the abundance ratio of non-vitreous inorganic oxide is lower in the region 14 bordering the plating layer 10 than in the region 15 bordering the glass ceramic layer 2. This reduces the amount of glass that gets exposed on the surface of the surface electrode 5, thereby ensuring good conductivity and, therefore, good platability, making the plating layer 10 more firmly adhere to the surface electrode 5 and the plating layer 10 less likely to peel off of the surface electrode 5.

Figure 4:
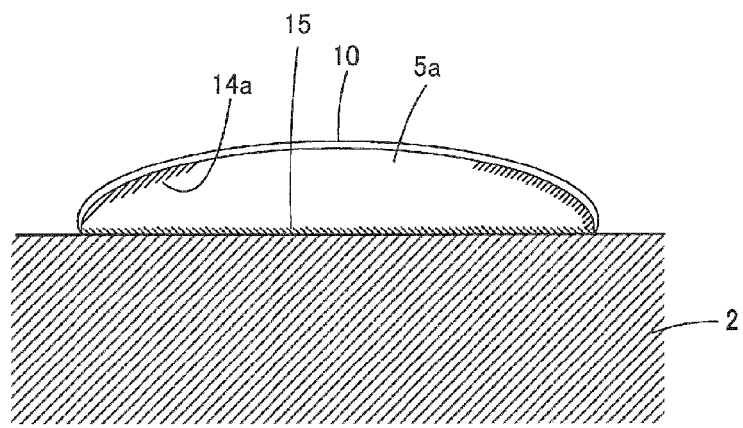
FIG. 4 illustrates Embodiment 2 of the invention, corresponding to FIG. 2.
Figure 5:
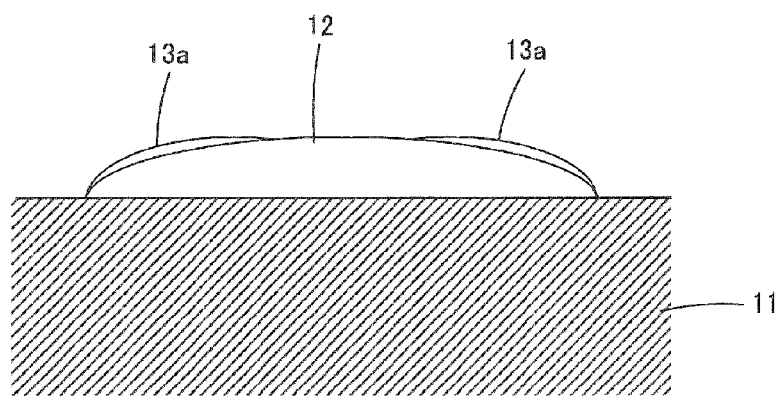
FIG. 5 is a cross-sectional diagram illustrating first and second conductive pastes applied to obtain the surface electrode illustrated in FIG. 4.

The following describes Embodiment 2 of the invention with reference to FIGS. 4 and 5. FIGS. 4 and 5 correspond to FIGS. 2 and 3, respectively. In FIGS. 4 and 5, like reference signs represent like elements in FIGS. 2 and 3. The details of the elements already described herein are omitted in the following.

A characteristic of Embodiment 2 is that the second paste film 13a covers only the edge portion of the first paste film 12 in a plan view like a picture frame as illustrated in FIG. 5. The configuration of the first paste film 12 and the second paste film 13a in a plan view is as in FIG. 6 (C), which is described later herein.

In Embodiment 2, in which the second paste film 13a is formed like a picture frame, the abundance ratio of non-vitreous inorganic oxide is relatively low in the edge portion of the surface electrode 5a in a plan view, i.e., the region derived from the second paste film 13a. As a result, the abundance ratio of non-vitreous inorganic oxide in the surface electrode 5a is lower in the region 14a bordering the plating layer 10 than in the region 15 bordering the glass ceramic layer 2 in the edge portion in a plan view.

As mentioned above, the first paste film 11 tends to be thinner in the edge portion in a plan view than in the middle portion because of the effects of printing defects such as running and bleeding of the printed paste. The glass component drawn up from the glass ceramic green sheet 11 into the first paste film 12 is therefore likely to reach the surface of the film and get exposed particularly in the edge portion in a plan view, the portions where the first paste film 12 is relatively thin. In other words, the amount of glass that gets exposed on the surface of the first paste film 11 is not as large in the middle portion in a plan view.

This means that the configuration in Embodiment 2, in which the second paste film 13a covers only the edge portion of the first paste film 12 in a plan view like a picture frame, or in other words reducing the amount of exposed glass at least in the edge portion of the surface electrode 5a in a plan view, ensures good conductivity and platability of the entire surface electrode 5a. Embodiment 2 therefore also makes, when a plating layer 10 is formed on the surface electrode 5a, the plating layer 10 less likely to peel off of the surface electrode 5a.

Furthermore, the configuration in Embodiment 2, in which the second paste film 13a covers only the edge portion of the first paste film 12 in a plan view like a picture frame, also provides improved coplanarity of the resulting glass ceramic substrate. The following describes this advantage in more detail.

Reduced coplanarity of a substrate, represented by events such as undulations of the substrate, is caused by the substrate being pulled as the electrodes on the substrate shrink during the firing process. If the electrodes contain only a small amount of non-vitreous inorganic oxide (e.g., $Al_2O_3$), the electrodes shrink earlier than the substrate and the amount of contraction is large. The substrate is pulled as the electrodes shrink and, as a result, undulates.

If the first conductive paste, which is used to form the first paste film 12, contained no non-vitreous inorganic oxide, therefore, not only the electrode would only weakly adhere to the ceramics, but also the coplanarity would be poor.

In Embodiment 1, the second paste film 13, which contains a relatively small amount of non-vitreous inorganic oxide, covers the entire first paste film 12, and this configuration requires a large amount of the second conductive paste to be applied to form the second paste film 13 (or over a large area in a plan view). Embodiment 1 therefore also leads to poor coplanarity due to contraction of the second conductive paste.

In Embodiment 2, however, the second paste film 13a, which is formed using the second conductive paste, covers only a frame-shaped area. This configuration requires a smaller amount of the second conductive paste to be applied (or over a smaller area in a plan view). The effect of the contraction of the second conductive paste is reduced, and the coplanarity is improved.

Although the foregoing takes a laminated glass ceramic substrate, or in other words a multilayer ceramic substrate, as an example to describe some embodiments of the invention, the present invention can also be applied to a single-layer glass ceramic substrate, i.e., a glass ceramic substrate having a single glass ceramic layer, a surface electrode on the glass ceramic layer, and a plating layer on the surface electrode.

The following describes an experiment the inventors conducted to verify the advantages of the present invention.

Experiment $SiO_2$, $BaCO_3$, $Al_2O_3$, $CeO_2$, $ZrO_2$, $TiO_2$, and $Nb_2O_5$ powders as starting materials were mixed and pulverized in wet conditions. The mixture was then dried and calcined.

The calcined powder was mixed and pulverized with a $MnCo_3$ powder and appropriate amounts of organic binder, dispersant, and plasticizer to form a ceramic slurry.

The ceramic slurry was shaped into a sheet using a doctor blade. The obtained sheet was dried to form a glass ceramic green sheet.

The glass ceramic green sheet was cut into smaller ones of the same size. The obtained glass ceramic green sheets were stacked and bonded together by thermal compression to form a green sheet laminate having a thickness of approximately 600 μm.

Separately, conductive pastes P-1 to P-8 were prepared from a Cu powder (the metal powder), $Al_2O_3$ (the non-vitreous inorganic oxide), and an organic vehicle in accordance with the volume proportions specified in Table 1.

TABLE 1

| Paste code | Cu powder (% by volume) | $Al_2O_3$ (% by volume) | Organic vehicle (% by volume) |
| --- | --- | --- | --- |
| P-1 | 36.0 | — | 64.0 |
| P-2 | 35.3 | 0.7 | 64.0 |
| P-3 | 34.2 | 1.8 | 64.0 |
| P-4 | 32.4 | 3.6 | 64.0 |
| P-5 | 28.8 | 7.2 | 64.0 |
| P-6 | 25.2 | 10.8 | 64.0 |
| P-7 | 21.6 | 14.4 | 64.0 |
| P-8 | 18.0 | 18.0 | 64.0 |

As the precursor to a surface electrode, two paste films were formed on the green sheet laminate. The conductive pastes listed in Table 1 were used as specified in "First paste film" and "Second paste film" columns in Table 2, and the paste films were formed in one of the following configurations A to D.

Figure 6:
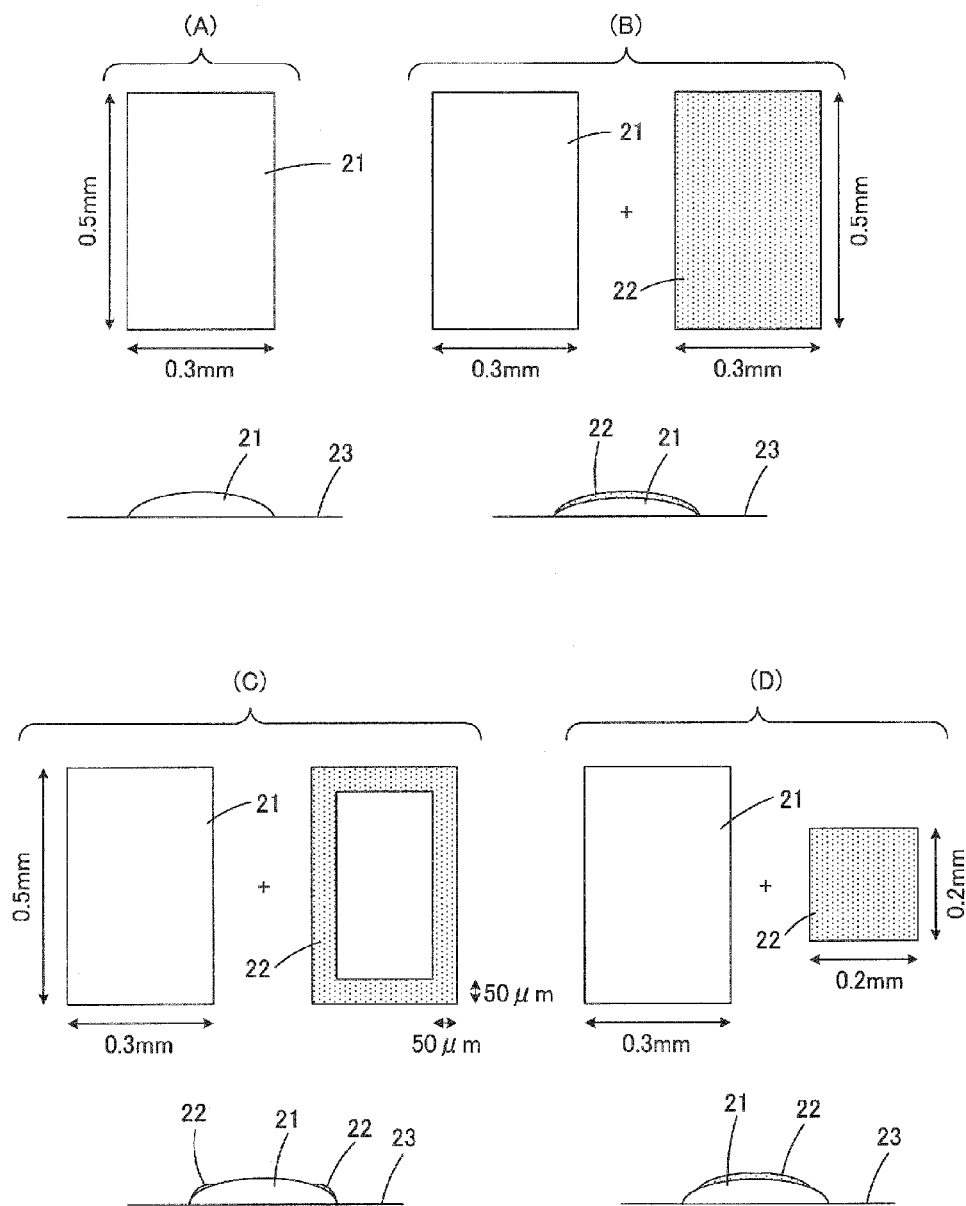
FIG. 6 illustrates four configurations (A), (B), (C), and (D) of applied conductive pastes used in the Experiment.

The following describes configurations A to D with reference to FIG. 6. FIGS. 6 (A) to (D) correspond to configurations A to D. In each of FIGS. 6 (A) to (D), the upper drawing is a plan view, and the lower drawing is a cross-sectional view. In FIG. 6, reference signs 21, 22, and 23 denote the first paste film, the second paste film, and a glass ceramic green sheet, respectively.

<<Configuration A>>

As illustrated in FIG. 6 (A), the first paste film 21 was formed on the glass ceramic green sheet 23 by screen printing. No second paste film was formed.

<<Configuration B>>

As illustrated in FIG. 6 (B), the first paste film 21 was formed on the glass ceramic green sheet 23 and then the second paste film 22 to cover the entire first paste film 21, by screen printing.

<<Configuration C>>

As illustrated in FIG. 6 (C), the first paste film 21 was formed on the glass ceramic green sheet 23 and then the second paste film 22 to cover only the edge portion of the first paste film 21 in a plan view, by screen printing.

<<Configuration D>>

As illustrated in FIG. 6 (D), the first paste film 21 was formed on the glass ceramic green sheet 23 and then the second paste film 22 to cover only the middle portion of the first paste film 21, by screen printing.

Which of these configurations A to D was used is indicated in "Paste film configuration" column in Table 2 by the letters A to D.

The green sheet laminate was then fired in a $N_2$—$H_2$—$H_2O$ non-oxidative atmosphere with the paste film(s) thereon. In this way, a glass ceramic substrate having dimensions of 0.5 mm×0.3 mm in a plan view was obtained in the form of a sintered green sheet laminate, while the paste film(s) was sintered to form a surface electrode on the glass ceramic substrate. The thickness of the surface electrode was approximately 11 μm in the middle portion in a plan view.

A plating layer was then formed on the surface electrode by plating the electrode with Ni and then Au. More specifically, the Ni plate was formed by immersing the glass ceramic substrate in an electroless Ni plating solution (an aqueous solution containing $NiSO_4$, copper sulfate, tartaric acid, sodium hydroxide, formaldehyde, and some other materials) with the surface electrode thereon and depositing a Ni plating film with a thickness of approximately 5 μm. After the substrate was washed with water, the Au plate was formed by immersing the glass ceramic substrate in an electroless Au plating solution which contained AuCN as the main component and depositing an Au plating film with a thickness of approximately 1 μm on the Ni plating film. The substrate was then washed with water.

Several glass ceramic substrates were obtained in this way for use as test samples.

The obtained samples were assessed for the peeling resistance of the surface electrode. More specifically, a tensile test was performed in which a lead wire was soldered to the plated surface electrode and then pulled in the direction perpendicular to the surface of the glass ceramic substrate. The tensile strength at which detachment occurred on the plated surface electrode was taken as the peeling resistance. Table 2 summarizes the peeling resistance assessments. The legend for "Peeling resistance" column in Table 2 is as follows: ⊙, the peeling resistance was 300 gf or more; ○, the peeling resistance was in the range of 250 gf to less than 300 gf; Δ, the peeling resistance was in the range of 200 gf to less than 250 gf; x, the peeling resistance was less than 200 gf.

The coplanarity of each sample was also assessed. The coplanarity assessments were made by measuring the undulation of the sample glass ceramic substrate using a laser displacement sensor. Table 2 summarizes the coplanarity assessments. The legend for "Coplanarity" column in Table 2 is as follows: ⊙, the undulation was less than 30 μm; ○, the undulation was in the range of 30 μm to less than 60 μm; x, the undulation was 60 μm or more.

TABLE 2

| Sample No. | First paste film Paste code | Second paste film Paste code | Paste film configuration | Peeling resistance (gf) | Coplanarity (μm) |
|---|---|---|---|---|---|
| 1* | P-1 | P-1 | B | X | X |
| 2* | P-1 | P-1 | C | X | X |
| 3* | P-1 | P-1 | D | X | X |
| 4* | P-1 | — | A | X | X |
| 5* | P-1 | P-7 | B | X | X |
| 6* | P-1 | P-7 | C | X | X |
| 7* | P-1 | P-7 | D | X | X |
| 8 | P-2 | P-1 | B | ○ | ○ |
| 9 | P-2 | P-1 | C | ○ | ⊙ |
| 10* | P-2 | P-1 | D | X | ○ |
| 11* | P-2 | — | A | X | ⊙ |
| 12* | P-2 | P-2 | B | Δ | ○ |
| 13* | P-2 | P-2 | C | Δ | ⊙ |
| 14* | P-2 | P-2 | D | X | ○ |
| 15 | P-3 | P-2 | B | ○ | ○ |
| 16 | P-3 | P-2 | C | ○ | ⊙ |
| 17* | P-3 | P-2 | D | X | ○ |
| 18 | P-4 | P-2 | B | ○ | ○ |
| 19 | P-4 | P-2 | C | ○ | ⊙ |
| 20* | P-4 | P-2 | D | X | ○ |
| 21 | P-5 | P-2 | B | ⊙ | ○ |
| 22 | P-5 | P-2 | C | ⊙ | ⊙ |
| 23* | P-5 | P-2 | D | X | ○ |
| 24 | P-6 | P-2 | B | ⊙ | ○ |
| 25 | P-6 | P-2 | C | ⊙ | ⊙ |
| 26* | P-6 | P-2 | D | X | ○ |
| 27 | P-7 | P-2 | B | ⊙ | ○ |
| 28 | P-7 | P-2 | C | ⊙ | ⊙ |
| 29* | P-7 | P-2 | D | X | ○ |
| 30 | P-8 | P-2 | B | ⊙ | ○ |
| 31 | P-8 | P-2 | C | ⊙ | ⊙ |
| 32* | P-8 | P-2 | D | X | ○ |

In Table 2, the samples having the sample number marked with the symbol * are outside the scope of the invention.

The results summarized in Table 2 indicate the following.

Samples 4 and 11, outside the scope of the invention, were "x" in peeling resistance. Since these samples had the first paste film only, a large amount of glass got exposed in the edge portion of the surface electrode in a plan view, causing the plating layer to adhere only weakly to the surface electrode.

Samples 1 to 7, outside the scope of the invention, were also "x" in peeling resistance. The first paste film was formed using conductive paste P-1, which contained no $Al_2O_3$ as the non-vitreous inorganic oxide, causing the surface electrode to adhere only weakly to the glass ceramic substrate. For these samples, the coplanarity assessment was also "x" because the first paste film shrank to a great extent during the sintering process.

Samples 3, 7, 10, 14, 17, 20, 23, 26, 29, and 32, outside of the scope of the invention, were "x" in peeling resistance. The use of configuration D, in which the second paste film covered only the middle portion of the first paste film, caused a large amount of glass to get exposed in the edge portion of the surface electrode in a plan view. As a result, the plating layer adhered only weakly to the surface electrode.

Samples 12 and 13, outside the scope of the invention, were "Δ" in peeling resistance. This is presumably because although forming the second paste film was effective in preventing the surface electrode from being thin in the edge portion thereof, the amount of glass that got exposed in the edge portion of the surface electrode was not reduced sufficiently because the first and second paste films were formed using the same conductive paste, P-2.

On the other hand, samples 8, 9, 15, 16, 18, 19, 21, 22, 24, 25, 27, 28, 30, and 31, falling within the scope of the invention, were "○" or "⊙" in peeling resistance. For these samples, the conductive paste used to form the second paste film contained less $Al_2O_3$ than that used to form the first paste film, and configuration B or C was used, in which the second paste film covered at least the edge portion of the first paste film in a plan view.

Some of these samples falling within the scope of the invention, or more specifically samples 8, 15, 18, 21, 24, 27, and 30, were only "○" in coplanarity because configuration B was used, in which the second paste film covered the entire first paste film.

On the other hand, samples 9, 16, 19, 22, 25, 28, and 31 were better in coplanarity with a result of "⊙" thanks to the use of configuration C, in which the second paste film covered only the edge portion of the first paste film like a picture frame.

Furthermore, samples 21, 22, 24, 25, 27, 28, 30, and 31 achieved "⊙" in peeling resistance. This is because the conductive paste used to form the first paste film contained at least 7% by volume $Al_2O_3$ as the non-vitreous inorganic oxide, making the glass ceramic substrate and the surface electrode bond more firmly with each other.

These samples falling within the scope of the invention, i.e., samples 8, 9, 15, 16, 18, 19, 21, 22, 24, 25, 27, 28, 30, and 31, were then inspected for the amounts of Al and Si in the region bordering the plating layer and the region bordering the glass ceramic layer.

The amounts of Al and Si in the region bordering the plating layer were determined by WDX in a cross section measuring 10 μm×10 μm taken along the thickness direction around a point 5 μm inside the surface electrode from the middle portion of the interface between the ceramic layer and the surface electrode in a plan view. Likewise, the amounts of Al and Si in the region bordering the glass ceramic layer were determined by WDX in a cross section measuring 10 μm×10 μm taken along the thickness direction around a point 20 μm approaching from the edge portion of the surface electrode in the plane direction to the middle portion and 5 μm inside the surface electrode from the interface between the surface electrode and the plating layer.

Then the amounts of Al and Si in the region bordering the plating layer were compared with those in the region bordering the glass ceramic layer. The region bordering the plating layer was found to contain less Al and less Si than the region bordering the glass ceramic layer, demonstrating that the region bordering the plating layer drew up a smaller amount of glass than the region bordering the glass ceramic layer thanks to the smaller amount of $Al_2O_3$.

REFERENCE SIGNS LIST

1 Glass ceramic substrate
2 Glass ceramic layer
5, 5a Surface electrode

10 Plating layer
11, 23 Glass ceramic green sheet
12, 21 First paste film
13, 13a, 22 Second paste film
14, 14a Region bordering the plating layer
15 Region bordering the glass ceramic layer

The invention claimed is:

1. A glass ceramic substrate comprising:
   a glass ceramic layer;
   an electrode adjacent the glass ceramic layer; and
   a plating layer adjacent the surface electrode,
   wherein an abundance ratio of a non-vitreous inorganic oxide in the electrode is lower in a first region bordering the plating layer than in a second region bordering the glass ceramic layer at least in an edge portion of the electrode, and both the first region and the second region contain the non-vitreous inorganic oxide.

2. The glass ceramic substrate according to claim 1, wherein the non-vitreous inorganic oxide is $Al_2O_3$.

3. The glass ceramic substrate according to claim 1, wherein the electrode is a surface electrode that is directly in contact with the glass ceramic layer.

4. The glass ceramic substrate according to claim 3, wherein the plating layer is directly in contact with the surface electrode.

5. The glass ceramic substrate according to claim 1, wherein the plating layer is directly in contact with the electrode.

6. A method for producing a glass ceramic, the method comprising:
   forming a first paste film on a glass ceramic green sheet by applying a first conductive paste containing a first metal powder and a first non-vitreous inorganic oxide to the glass ceramic green sheet;
   forming a second paste film by applying a second conductive paste containing a second metal powder and a second non-vitreous inorganic oxide to the first paste film so as to cover at least an edge portion of the first paste film; and
   firing the glass ceramic green sheet and the first and second paste films,
   wherein an amount of the second non-vitreous inorganic oxide in the second conductive paste is less than an amount of the first non-vitreous inorganic oxide in the first conductive paste.

7. The method for producing a glass ceramic substrate according to claim 6, wherein the first conductive paste contains 7% or more by volume of the non-vitreous inorganic oxide based on a total volume of the first conductive paste.

8. The method for producing a glass ceramic substrate according to claim 6, wherein the second paste film covers only the edge portion of the first paste film.

9. The method for producing a glass ceramic substrate according to claim 6, wherein the first non-vitreous inorganic oxide and the second non-vitreous inorganic oxide is $Al_2O_3$.

10. The method for producing a glass ceramic substrate according to claim 6, wherein the second paste film is thinner than the first paste film.

* * * * *